US005955139A

United States Patent [19]

Iturralde

[11] Patent Number: 5,955,139
[45] Date of Patent: Sep. 21, 1999

[54] AUTOMATIC FILM DEPOSITION CONTROL

[75] Inventor: Armando Iturralde, San Antonio, Tex.

[73] Assignees: Sony Corporation, Park Ridge, N.J.; Sony Electronics Inc., Tokyo, Japan

[21] Appl. No.: 08/896,813

[22] Filed: Jul. 18, 1997

Related U.S. Application Data

[62] Division of application No. 08/433,813, May 3, 1995, Pat. No. 5,665,214.

[51] Int. Cl.$^6$ .............................. B05D 3/14; C23C 14/34
[52] U.S. Cl. ......................... 427/9; 427/10; 204/192.13; 324/71.5
[58] Field of Search ........................ 204/192.13, 298.03; 427/9, 10; 324/71.5

[56] References Cited

U.S. PATENT DOCUMENTS

| | | | |
|---|---|---|---|
| 4,379,040 | 4/1983 | Gillery ................................ | 204/192 P |
| 4,588,942 | 5/1986 | Kitahara ................................ | 324/71.5 |
| 4,957,605 | 9/1990 | Hurwitt et al. .................... | 204/192.12 |
| 5,091,320 | 2/1992 | Aspnes et al. ............................. | 437/8 |
| 5,126,028 | 6/1992 | Hurwitt et al. .................... | 204/192.13 |
| 5,131,752 | 7/1992 | Yu et al. ................................. | 356/369 |
| 5,354,575 | 10/1994 | Dagenais et al. ........................ | 427/10 |
| 5,494,697 | 2/1996 | Blayo et al. ............................. | 427/10 |
| 5,503,707 | 4/1996 | Maung et al. ....................... | 156/626.1 |
| 5,665,214 | 9/1997 | Iturralde ............................. | 204/298.03 |

OTHER PUBLICATIONS

Product brochure of Low Entrophy Systems, Inc. entitled 1000–IS, Full Wafer Imaging Interferometer.
Product brochure of Sycon Instruments, Inc., STM–100, Thickness/Rate Monitor.
Product brochure of Sycon Instruments, Inc. STC–200, Thin Film Deposition Controller.
Product brochure of Tylan Corporation, "FC–260 Series Mass Flow Controllers".
Product brochure of J. A. Woollam Co., Inc., "Multi–Wavelength In Situ Ellipsometer".
Publication of The Electrochemical Society, Inc., Extended Abstracts, vol. 95–1, Abstract 101, pp. 155–156, "Real–Time Optical Diagnositcs for 0.25 $\mu$m Gate Etching Process Control: Optical Emission, Full Wafer Interferometry, and UV–Visible Ellipsometry" by J.T.C. Lee, et al.
Publication of Solid State Technology, Jul., 1979, An analysis of LPCVD System Parameters for Polysilicon, Silicon Nitride and Silicon Dioxide Deposition.

*Primary Examiner*—Nam Nguyen
*Assistant Examiner*—Steven H. VerSteeg
*Attorney, Agent, or Firm*—Wood, Herron & Evans, L.L.P.

[57] ABSTRACT

A film deposition control system and method in which a deposition rate monitor and an ellipsometer are used to control the thickness of a thin film being deposited on a wafer. The ellipsometer is also used to detect the refractive index of the thin film being deposited, and the detected refractive index value is used to control the ratio of the reactive gases being injected into the processing chamber.

11 Claims, 3 Drawing Sheets

AUTOMATIC FILM DEPOSITION CONTROL

This is a division of application Ser. No. 08/433,813, filed May 3, 1995, now U.S. Pat. No. 5,665,214.

FIELD OF THE INVENTION

The invention relates generally to process equipment and a method for depositing thin films on a sample, and more particularly, to a film deposition control system including a deposition rate monitor and an ellipsometer for controlling the thickness of the deposited film to a film thickness set point.

BACKGROUND OF THE INVENTION

The deposition of thin films, for example, films of silicon dioxide onto a silicon wafer or substrate, may be performed by any one of several well known processes. Such processes include chemical vapor deposition or physical vapor deposition, such as, sputtering. Regardless of the deposition process utilized, the final thickness of the deposited thin film is an important variable which heretofore has been subject to various methods of control.

In a typical thin film deposition process, one or more test wafers or substrates are placed in a vacuum deposition chamber, and the deposition process is executed in accordance with empirically determined process parameters. At the end of the deposition process, the test wafer is removed from the deposition chamber; and the film thickness is measured with measuring equipment. If the measured thin film thickness deposited on the test wafer does not correspond with the desired film thickness, the process parameters are adjusted; and a second test wafer is cycled through the deposition chamber. The above experimental process is repeated until a set of experimentally determined process parameters is found which produce the desired thin film thickness on the test wafers. Thereafter, production wafers are cycled through the deposition chamber utilizing the experimentally determined process parameters.

At predetermined intervals, monitor, or test, wafers are again cycled through the deposition chamber; the deposited thin film thickness measured; and the experimentally determined processing parameters are adjusted so that the deposition chamber continuously produces thin films of the desired thickness. A reiterative thickness calibration process as described above has the disadvantages of being relatively time consuming and inefficient. First, the initial and subsequent calibration processes consume numerous test wafers; and if done extensively, requires several sets of measuring equipment for measuring the test wafer. Second, the production process is halted while the thin film deposition chamber is used for the calibration process during which the initial or subsequent processing parameters are determined and recalibrated during the production run.

Given a set of starting processing parameters that provide the desired thickness of the thin film, there have been several efforts to control the process. For example, as disclosed in the Hurwitt, et al. U.S. Pat. No. 4,957,605, entitled METHOD AND APPARATUS FOR SPUTTER COATING STEPPED WAFERS, with test wafers having surfaces of different geometric characteristics, for example, stepped surfaces, control parameters that determine the operation of the deposition process are varied in accordance with feedback measurements of deposition rate and film thickness. While that apparatus is useful for providing more uniform thin film coating over geometrically diverse surfaces, the disclosed apparatus utilizes the traditional time consuming and inefficient reiterative test sample calibration process. Further, there is no disclosure of controlling the film thickness to a film thickness set point.

The Hurwitt, et al. U.S. Pat. No. 5,126,028 entitled SPUTTER COATING PROCESS CONTROL METHOD AND APPARATUS, discloses a deposition process in which the desired thickness of the coating and the desired deposition rate are entered as input process parameters. Thereafter, other process parameters are calculated, and a thin film deposition process is executed. The thickness of the deposited film on that test wafer is measured; and new process parameters are calculated as a function of the difference between the measured coating thickness and the input parameter representing the desired coating thickness. Those new process parameters are then used to deposit a thin film on the next test wafer to be processed. While this approach provides an improved coating thickness control from one deposition cycle to another, it has the disadvantage of not providing a real time, closed loop set point control of the film thickness within a deposition cycle itself.

Commercially available production control equipment, for example, the model STC-200 thin film deposition controller available from Sycon Instruments, Inc. of East Syracuse, N.Y., provides a capability of terminating the thin film deposition process at a thickness determined by thickness monitoring equipment. The controller utilizes a sensor within the deposition chamber that is located in close proximity to the thin film wafer. Theoretically, as material is deposited on the wafer, a like layer of material is being deposited on the sensor in close proximity to the wafer. The sensor contains a quartz crystal which changes frequency as a function of the thickness of the film being deposited on the crystal. Further, the monitor measures the run time of the deposition cycle, and provides a first output signal which represents the rate at which the film is being deposited on the sensor. A second output signal represents film thickness. While the monitor operates in a satisfactory manner, the monitor measures the thickness of the film on its sensor and not the wafer itself; and therefore, there are limits to its accuracy. Consequently, small variations and inconsistencies within the deposition process, which result in differences between the deposition on the wafer and the monitor sensor, will contribute error to the thickness control.

Another instrument for producing an output signal representing film thickness during the film deposition process is an in-situ spectroscopic ellipsometer of the type available from J. A. Woollam Company, Inc. of Lincoln, Nebr. Spectroscopic ellipsometry has long been known to be a tool for characterizing the physical properties of surfaces, thin films, and multilayer structures. The in-situ ellipsometer is mounted in the deposition chamber so linearly polarized light is directed on and reflected off of the thin film layer being deposited. The reflected light is elliptically polarized, and the optical characteristics of the polarized light are measured. Those measured characteristics are analyzed in a computer within a model of the sample structure to provide output data representing the thickness of the layer being deposited and other optical constants, for example, the refractive index. As with the rate controller previously described, thickness is not directly measured, but is determined as a function of measuring other parameters, for example, with the ellipsometer, the optical characteristics of the surface. While an ellipsometer provides a satisfactory indication of film thickness, the ellipsometer has the disadvantage of not being implemented within a control loop in which the deposition process is controlled to accurately deposit a thin film to the desired thickness in the shortest time.

The above approaches have a further disadvantage in that there is no closed loop control of the ratio of the different reactive gases flowing through the deposition chamber, which ratio is correlated to thin film refractive index.

SUMMARY OF THE INVENTION

To overcome the above disadvantages and inefficiencies of known thin film deposition processes, an object of the present invention is to provide an automatic, thin film deposition control method and system in which the desired thin film thickness is more accurately achieved in a shorter deposition cycle.

According to the principles of the invention, a thin film of a desired thickness is deposited on a wafer within a thin film processing chamber. A deposition rate monitor is mounted with respect to the deposition chamber and produces a deposition rate feedback signal as a function of the rate of deposition of the thin film on the wafer. In addition, an ellipsometer is mounted with respect to the film deposition chamber and produces a film thickness feedback signal as a function of measured optical characteristics which are correlated to the thickness of the thin film being deposited on the sample. A thickness controller is connected to the process controller, the deposition rate monitor and the ellipsometer, and provides a film thickness control signal for controlling the film deposition process as a function of the rate feedback signal, the film thickness feedback value and a film thickness set point value.

Another embodiment of the invention provides a closed loop control of a gas flow ratio of the two reactive gases used in the thin film deposition process. A gas flow controller is connected to the processing chamber and controls the flow of the gases thereto in response to a gas ratio set point signal having a value representing a desired flow of one of the gases. The ellipsometer mounted with respect to the processing chamber produces a refractive index signal representing a value of the refractive index of the thin film being deposited on the wafer. A gas ratio controller is connected to the gas flow controller and the ellipsometer and modifies the gas flow set point signal as a function of the refractive index signal.

These and other objects and advantages of the present invention will be more readily apparent during the following detailed description together with the drawings herein.

DETAILED DESCRIPTION OF THE INVENTION

Figure 1:
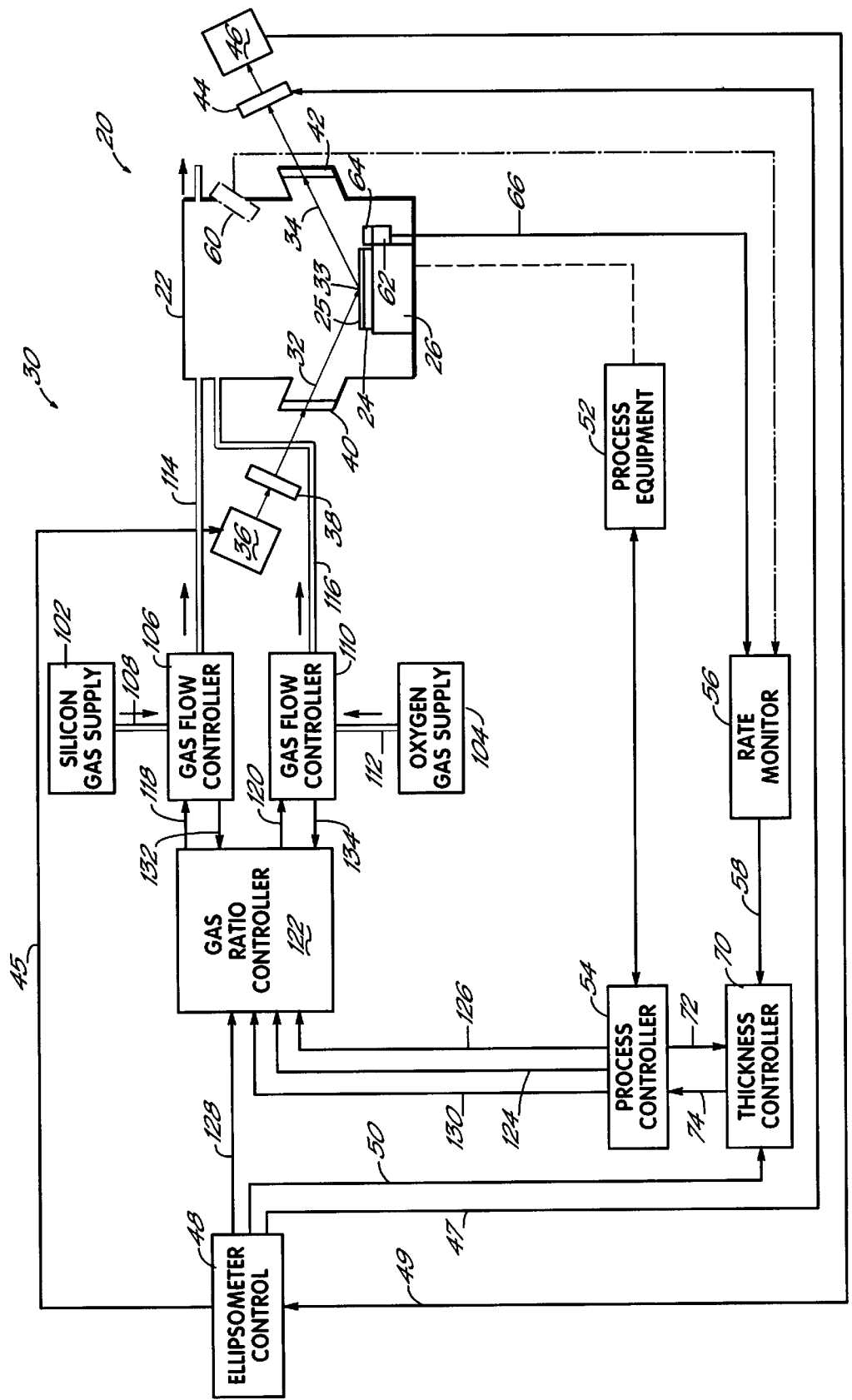
FIG. 1 is a schematic block diagram illustrating the control system in accordance with the principles of the present invention.

Referring to FIG. 1, a thin film processing chamber 20 includes a vacuum chamber 22 in which a sample or wafer 24 is mounted on a work holder or pallet 26. The thin film processing chamber may be one of any of the various devices for implementing a thin film material deposition process to deposit a thin film layer 25 on the wafer 24. The thin film processing chamber 20 may be de signed to process a single or a batch of wafers 24 and may be designed to integrate with a production line in which the wafers 24 and pallets 26 are automatically moved between the thin film processing chamber 20 and other processing stations on the production line.

A spectroscopic ellipsometer 30 is mounted with respect to the thin film processing chamber 20 so that an incident beam of light 32 is directed onto a selected surface 33 of the thin film 25 on the wafer 24 to produce a reflected beam of light 34. The incident light beam 32 is provided by a light source 36 producing a collimated monochromatic light beam. The source 36 of the collimated light beam can be, for example, a He—Ne laser, or other laser sources, a gas discharge type arc lamp source with a collimating optics assembly, a light emitting diode with a collimating optics assembly, a laser diode, etc. A beam splitter, fiber optics or other devices may be used to transport or transform the light beam before it is linearly polarized by polarizer 38. The polarized monochromatic incident light beam 32 passes through a fused silica or quartz window 40 in one side wall of the vacuum chamber 22. The incident light beam strikes the wafer 24, and a reflected light beam 34 passes through a second fused silica or quartz window 42, through a rotating analyzer 44 and is received by a detector 46, for example, silicon photo detector. The detector 46 produces an output signal having a value proportional to the intensity of the light that it receives. Other photodetectors, photosensors, or photodiodes may be used depending on the wave length of the light and polarization sensitivity. The operation of the light source 36 and the rotating analyzer 44 is controlled by signals on lines 45 and 47, respectively, from the ellipsometer control 48. The ellipsometer control is responsive to the output signal line 49 from the photo detector 46 to determine the ellipsometric parameters. The ellipsometer control uses the ellipsometer parameters in a computer based model of the wafer 24 to provide a film thickness feedback output signal on line 50 as a function of the measured optical characteristics of the layer of thin film 25 being deposited on the wafer 24. The ellipsometer 30 may be implemented using a multi-wavelength in-situ ellipsometer such as that commercially available from J. A. Woollam Company, Inc. of Lincoln, Nebr.

The thin film processing chamber 20 further includes process equipment 52 which is mechanically and otherwise operably connected to a vacuum chamber 22. Such equipment may include pressure and temperature equipment, for example, vacuum pumps, fans, heaters, etc., and RF plasma equipment, for example, a plasma generator, etc. The operation of the process equipment 52 is controlled by a process controller 54. The exact selection, configuration and operation of the process equipment 52 will be a function of the particular deposition process being used.

A rate monitor 56 has a sensor mounted with respect to the thin film processing chamber 20 and produces a deposition rate feedback signal on output line 58 as a function of a rate of deposition of the thin film 25 on the wafer 24. The preferred embodiment of the rate monitor will vary as a function of the deposition process being utilized. For example, if the deposition process is a plasma chemical vapor deposition process, the rate monitor is preferably an interferometer that has a sensor 60, shown in phantom, which may, for example, be a CCD sensor. The interferometer further includes optics and a computer and associated software within the rate monitor 56 for processing the CCD images of the wafer 24. A rate monitor of the type described is commercially available as a Wafer Imaging Interferometer from Low Entropy Systems, Inc. of Somerville, Mass.

If the deposition process within the processing chamber 20 is a physical deposition process, for example, a nonmetallic sputtering process, the rate monitor 56 is preferably implemented using a process controller of the type that is commercially available as model STC 200 thin film deposition controller from Sycon Instruments of East Syracuse, N.Y. Such a deposition controller includes a sensor 62, for example, a quartz crystal, attached to or in the immediate proximity of the work holder or pallet 26 which supports the wafer 24. The sensor 62 being in close proximity to the wafer 24 will have deposited on it a thin film 64, which is theoretically, substantially identical to the thin film 25 being deposited on the wafer 24. As the film 64 accumulates on the sensor 62, the frequency of the quartz crystal of the sensor 62 changes, and the quartz crystal frequency is detected by the rate monitor 56 via line 66. As the frequency of the quartz crystal within the sensor 62 changes, the rate monitor 56 provides on an output line 58, a deposition rate signal having a value, for example, a magnitude value, representing the rate at which a thin film 64 is accumulating or growing on the sensor 62.

A thickness controller 70 is connected to the ellipsometer control 48, the rate monitor 56, and the process controller 54 and preferably, receives over line 72 from the process controller 54 a thickness set point signal having representing a desired film thickness to be deposited on the wafer. The thickness controller 70 provides on output 74, a film thickness control signal to the process controller for controlling the film deposition process as a function of the deposition rate feedback signal on line 58, the film thickness set point signal on line 72 and the film thickness feedback signal on line 50.

Figure 2:
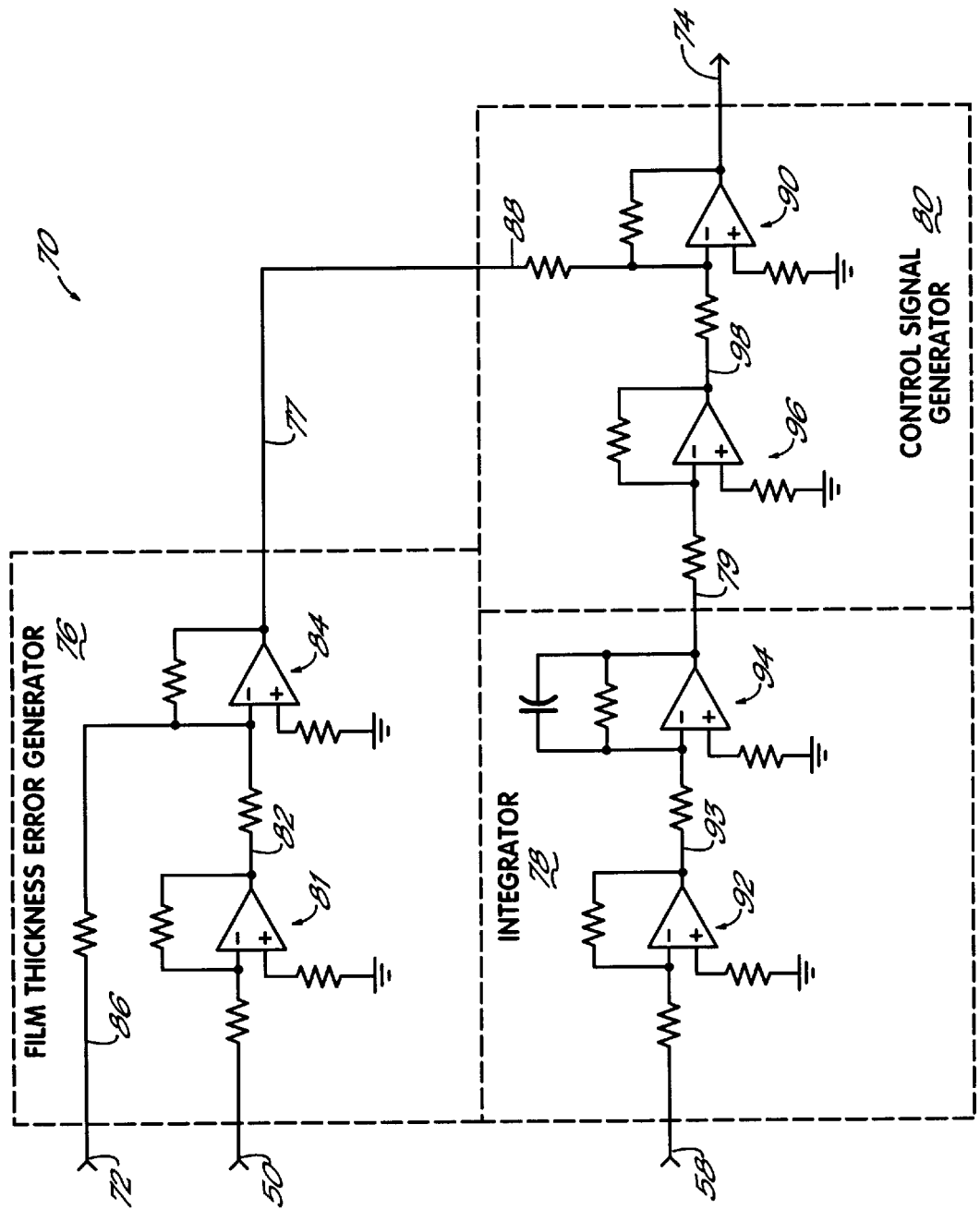
FIG. 2 is a more detailed schematic diagram illustrating the elements of the film thickness controller.

The thickness controller 70 is illustrated in more detail in FIG. 2. The thickness controller 70 includes a film thickness error generator 76 which compares the film thickness detected by the ellipsometer 30 as represented by the film thickness feedback signal on line 50 to the desired film thickness as represented by the film thickness set point signal on line 72. The difference between the desired and the detected film thickness is represented by a film thickness error signal on output 77 of the film thickness error generator 76. An integrator 78 is responsive to the deposition rate signal on line 58 from the rate monitor 56 to produce an integrated deposition rate signal on an output 79 of the integrator 78. A control signal generator 80 is responsive to the integrated deposition rate signal on output 79 and the film thickness error signal on output 77 to provide a control signal on an output 74 to the process controller 54.

The film thickness feedback signal is an analog signal having a magnitude value preferably ranging from ±5 vdc. The film thickness feedback signal is inverted in an inverter circuit 81 and is provided to one input 82 of an algebraic summing circuit 84. The other input 86 of the summing circuit 84 is connected to the output 72 from the process controller 54 which provides the film thickness set point signal which is also an analog signal having a magnitude value preferably ranging from ±5 vdc. The output 77 of the summing circuit 84 is connected to one input 88 of a second summing circuit 90. The rate deposition signal on line 58 is an analog signal having a magnitude value preferably ranging from ±10 vdc and passes through an attenuating inverter 92 which preferably reduces the magnitude of the deposition rate signal to preferably approximately one-half its value. The attenuated deposition rate signal on line 93 then passes through an inverting integrator 94 which is connected to an inverter 96. The output of the inverter circuit 96 is connected to the second input 98 of the summing circuit 90. The output 74 of the summing circuit 90 is the film thickness control signal that is input to the process controller 54. The process controller may utilize the film thickness control signal in well known proportional, integral or derivative control loops to control the operation of the process equipment 52, for example, to change gas flows, temperature, power, etc.

In a deposition process such as a chemical deposition process, two reactive gases, for example, oxygen and a silicon bearing gas, such as, silane, are injected in a predetermined proportion or ratio into the processing chamber 20 of FIG. 1. Silicon and oxygen molecules are deposited as the thin film 25 on the wafer 24. The gases are provided by a silicon gas supply 102 and an oxygen gas supply 104. The silicon and oxygen gas supplies 102, 104 include a source of the respective gas, regulators, valves, pumps, and other known equipment to supply a desired gas of the required purity and pressure for use in the processing chamber 20. A first gas flow controller 106 receives the silicon gas through lines or pipes 108 from the supply 102. A second gas flow controller 110 receives oxygen gas through supply lines or pipes 112 from the oxygen gas supply 104. The gas flow controllers 106, 110 are known devices that regulate the flow rate of their respective gases through lines 114, 116 to the processing chamber 20. Typically, such gas flow controllers may be implemented using a mass flow controller commercially available from Tylan of Los Angeles, Calif. By regulating the flow rates of the respective gases, the gas flow controllers 106, 110 provide those gases to the processing chamber in a predetermined proportion or ratio. Each of the gas flow controllers 106, 110 receives a gas flow set point signal on lines 118, 120, respectively, from a gas ratio controller 122. Each of the gas flow set point signals represents a desired flow rate of gas into the processing chamber 20. The gas ratio controller 122 receives silicon and oxygen input set point signals on outputs 124 and 126 of the processing controller 54.

In addition to detecting film thickness, the ellipsometer 30 may be used to produce a signal or value on an output 128 of the ellipsometer control 48 representing the refractive index of the thin film layer 25 being deposited on the wafer 24. The refractive index of the thin film layer 25 is indicative of and directly correlated to the ratio of the silicon and oxygen gases being provided to the processing chamber 20. The gas ratio controller 122 further receives a refractive index set point signal on output 130 from the process controller 54. The gas flow controllers 106, 110 measure or otherwise detect the flow of silicon and oxygen, respectively, going into the lines 114, 116. Based on that detection or measurement, the gas flow controllers 106, 110 provide measured gas flow signals on outputs 132, 134, respectively, representing the measured flows of the silicon and oxygen gases through the lines 114, 116. The gas ratio controller 122 determines a detected change in the refractive index of the thin film as a function of the flow of the silicon and oxygen gases to the processing chamber 20. The gas ratio controller 122 further determines a detected change in the refractive index of the thin film based on the refractive index signal from the ellipsometer and the refractive index set point. The gas ratio controller 122 then modifies one of the gas flow set point signals as a function of the desired and the detected changes in the refractive index of the thin film 25.

Figure 3:
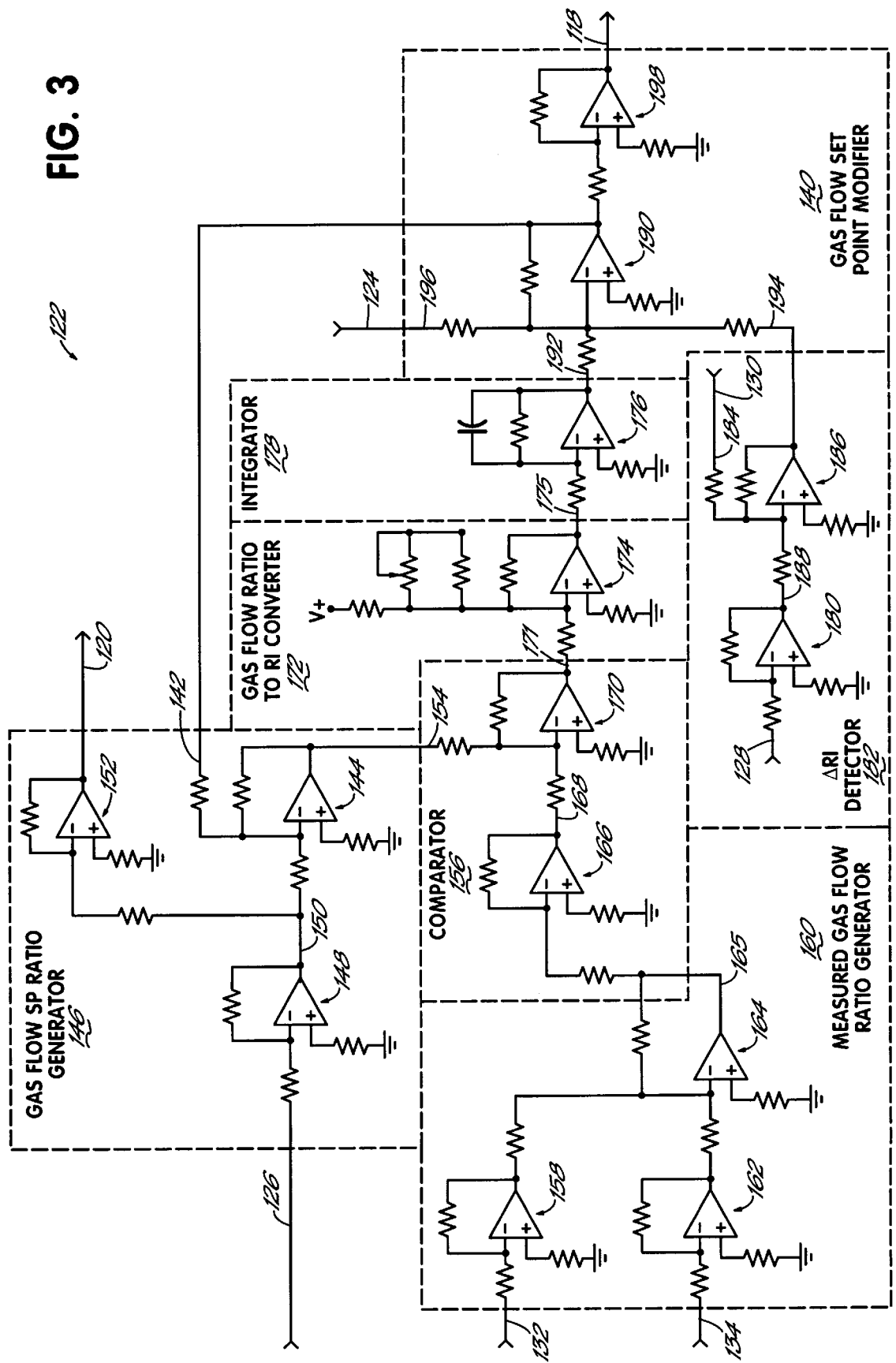
FIG. 3 is a more detailed schematic diagram illustrating the elements of the gas ratio controller.

The gas ratio controller 122 is shown in more detail in FIG. 3. The input silicon gas set point signal on output 124 from the process controller 54 passes through a gas flow set point modifier 140 the operation of which will be subsequently described. The modified silicon gas flow set point is provided to one input 142 of an algebraic summing circuit 144 within a gas flow set point ratio generator 146. The input oxygen set point signal on output 126 of the process controller 54 passes through an inverter circuit 148 of the gas flow set point ratio generator 146 and is thereafter provided to a second input 150 of the summing circuit 144. In addition, the oxygen set point signal passes through a second inverting circuit 152 and is provided as a output oxygen set point signal on the output 120 of the gas ratio controller 122 which is connected to the oxygen gas flow controller 110 of FIG. 1. Therefore, the oxygen gas flow set point signal passes unchanged from the process controller 54 to the gas ratio controller 152 to the oxygen gas flow controller 110. The output of the summing circuit 144 is connected to one input 154 of a comparator 156 and represents a desired gas ratio signal having a value that is correlated to and changes as a function of changes in the ratio of the silicon and oxygen set point signals on outputs 124, 126 from the process controller 54.

The signal on output 132 of the silicon gas flow controller 106 represents the measured or detected silicon gas flow into the line 114 and passes through an inverter circuit 158 of a measured gas flow ratio generator 160. The signal on output 134 from the oxygen gas flow controller 110 represents the measured or detected flow of oxygen gas into the line 116 and passes through an inverter circuit 162. The outputs of the inverter circuits 158, 162 are input to an algebraic summing circuit 164 which provides on an output 165 a measured gas ratio signal that is correlated to and changes as a function of changes in the proportioning or ratio, that is, the flows, of the silicon and oxygen gases flowing from the gas flow controllers into the into the lines 114, 116. The measured gas flow ratio signal from the summing circuit 164 passes through an inverter 166 of the comparator 156 to another input 168 of an algebraic summing circuit 170. The output 171 of the comparator circuit 170 is an analog gas ratio error signal that represents over time, the rate of change of the difference between a first ratio of the silicon and oxygen gases as represented by the predetermined set point values and a second gas flow ratio determined from the measurement of gas flows from the gas flow controllers 106, 110. The output 171 from the comparator circuit 170 is an input to a gas flow ratio to refractive index converter 172 which is comprised of an attenuating inverter circuit 174.

There is a direct correlation between the ratio of the silicon and oxygen gases flowing within the processing chamber 20 and the refractive index of the film 25 being deposited on the wafer 24. The gas flow ratio to refractive index converter 172 is, in essence, a scaling circuit that receives an analog signal having a value, for example, a magnitude correlated to the gas flow ratio and produces an output analog signal having a value, for example, a magnitude that is scaled to be correlated with analog signals representing the refractive index in other portions of the gas ratio controller 122. The output 175 of the gas flow ratio to refractive index converter 172 represents overtime, the rate of change in the refractive index of the thin film 25. The output of the attenuating inverter circuit 174 passes through an integrating circuit 176 within the integrator 178. The output of the integrator 178 is an analog signal representing a time-based integral of the refractive index error of the thin film 25 as determined from the gas flow ratio.

The gas ratio controller 122 further receives on an output 128 of the ellipsometer control 48, a refractive index signal representing a detected value of the refractive index of the thin film 25 being deposited on the wafer 24. The refractive index signal on line 128 passes through an inverter circuit 180 within a change in refractive index detector 182. The gas ratio controller 122 also receives on output 130 of the process controller 54, an analog input signal representing a desired refractive index set point value which is connected to one input 184 of an algebraic summing circuit 186. The output of the inverting circuit 180 is connected to a second input 188 of the summing circuit 186. The summing circuit 186 produces an analog output signal from the change in refractive index detector 182 having a value, for example, a magnitude, representing a detected change of the refractive index of the thin film 25 being deposited on the wafer 24 with respect to the refractive index set point value. The gas flow set point modifier 140 has an algebraic summing circuit 190 that includes a first input 192 connected to the output of integrator 178 which represents the refractive index error as determined from the gas flow ratio. The summing circuit 190 has a second input 194 connected to the output of the change in refractive index detector 182 representing a detected change in the refractive index, and a third input 196 connected to the silicon gas flow set point signal on line 124. Consequently, the summing circuit 190 is effective to modify the input silicon set point signal as a function of the desired change in the refractive index and the detected change of the refractive index of the thin film being deposited on the wafer. The modified input silicon gas flow set point signal is provided as an input 142 to the gas flow set point ratio generator 146. Therefore, the set point of one of the gases, for example, the silicon gas, is modified as a function of the difference between the desired and the detected refractive index of the thin film. The modified silicon gas flow set point passes through inverter circuit 198 to the output 118 of the gas ratio controller 122 and is connected to the silicon gas flow controller 106. Therefore, the silicon gas flow controller regulates the flow of silicon gas in accordance with the modified silicon gas set point value.

In use, referring to FIG. 1, a wafer 24 is loaded into the vacuum chamber 22 and mounted on the work holder 26. The process controller 54 then activates the gas flow controllers 106, 110 and the process equipment 52 to begin the material deposition process which includes providing reactive gases to the vacuum chamber 22. As a layer of material 25 is deposited on the wafer 24, the ellipsometer by direct measurement of the optical characteristics of the thin film 25 provides a feedback signal on line 50 representing the detected thin film thickness. In addition, the rate monitor 56, by measuring the rate at which a thin film 64 is being deposited on the sensor 62, provides on line 68 a deposition rate feedback signal. The thickness controller 70 is responsive to those two feedback signals, as well as the film thickness set point value on line 72 to provide a film thickness control signal 74 to the process controller 54. The process controller is then able to control parameters which regulate the deposition of the thin film 25 on the wafer 24 in accordance with the one of several known control processes being used. The film thickness control signal on line 74 permits the process controller to deposit the thin film 25 at a rate so that as measured by the ellipsometer 30, the thickness of the thin film 25 becomes exactly equal to and does not overshoot or become greater than the film thickness set point value. The use of the ellipsometer 30 and rate monitor 56 causes the thin film deposition on the wafer 24 to more accurately correspond to the desired film thickness set point value. Further, since the desired film thickness can be more reliably manufactured, less monitoring and recalibration of the system is required. That results in less use of monitor wafers and monitoring equipment and less loss of production time for monitoring purposes. Therefore the thin film deposition process is more cost effective and efficient.

During the deposition of the thin film 25 on the wafer 24, the gas ratio controller 122 determines a ratio of the flow of the silicon and oxygen gases as detected by the gas flow controllers 106, 110. In addition, the gas ratio controller 122 determines the ratio of the silicon and oxygen gas flow set points. The difference in those ratios is converted to an equivalent refractive index value and integrated. The resulting signal represents a desired change in the refractive index value of the thin film being deposited on the wafer. The gas ratio controller 122 is also responsive to the refractive index detected by the ellipsometer 30 and provides a signal representing the detected change in the refractive index of the thin film 25 being deposited on the wafer 24. The difference between the detected change in the refractive index and the desired change in the refractive index is used to modify one of the set point signals, for example, the silicon set point signal. Therefore, the ratio of the gases flowing into the processing chamber are more closely regulated. By maintaining a more accurate control over the ratio of the gases flowing into the processing chamber, the refractive index of the thin film is more closely controlled which in turn provides a more accurate control over the refractive index. Higher quality control over the thin film manufacturing process permits the thin film to be deposited in less time and with fewer wafers that are out of tolerance or do not meet desired specifications. Hence, again, the cost effectiveness and efficiency of the thin film deposition process is improved.

While the invention has been set forth by a description of the embodiment in considerable detail, it is not intended to restrict or in any way limit the claims to such detail. Additional advantages and modifications will readily appear to those who are skilled in the art. For example, while the various set point signals preferably are provided by manual data entry or by the process controller 54, the set point signals may also be provided by manual data entry or by an independent control element, for example, a computer that has lookup tables that provide process parameters, such as the set point values. Further, preferably the gas flow controllers 106, 110 provide a signal to the gas ratio controller representing the measured or detected flow of gases output from the gas flow controllers 106, 110. Alternatively, gas flows through the lines 114, 116 may be detected and measured by other known mechanisms that would provide comparable input signals to the gas ratio controller. Further, the thickness controller 70 and the gas ratio controller 122 are disclosed as circuits processing analog signals with analog devices. As is appreciated, the thickness controller 70 and gas ratio controller 122 may be implemented utilizing digital signal processing elements that provide equivalent functions to the analog circuits illustrated in FIGS. 2 and 3. The gas supplies 102 and 104 preferably provide silicon and oxygen gases, respectively. Depending on the type of thin film being deposited on the wafer 24, and the deposition process being used, other reactive gases, such as, for example, dichlorosilane, silicon dioxide, silicon nitride, etc. may also be used.

The invention therefore in its broadest aspects is not limited to the specific details shown and described. Accordingly, departures may be made from such details without departing from the spirit and scope of the invention.

What is claimed is:

1. A method for controlling a thickness of a thin film being deposited by a thin film deposition process on a wafer located in a thin film processing chamber, the method comprising:

operating a deposition rate monitor mounted with respect to the thin film processing chamber to produce a deposition rate feedback signal correlated to a rate of deposition of the thin film on the wafer;

operating an ellipsometer mounted with respect to the thin film processing chamber to produce a film thickness feedback signal as a function of measured optical characteristics of the thin film being deposited on the wafer; and producing a film thickness control signal to control the film deposition process as a function of the deposition rate feedback signal, the film thickness feedback signal and a film thickness setpoint signal.

2. The method of claim 1 further comprising:

operating the ellipsometer to produce a refractive index signal representing a detected value of a refractive index of the thin film being deposited on the wafer;

modifying as a function of the refractive index signal, a gas flow set point signal having a value representing a desired flow of one of two gases being used in processing the thin film on the wafer; and controlling flows of the two gases to the thin film processing chamber as a function of the gas flow set point signal as modified by a gas ratio controller.

3. A method of claim 2 comprising:

producing a first signal having a value representing a desired change in the refractive index of the thin film on the wafer as a function of the flows of the two gases to the thin film processing chamber;

producing in response to the refractive index signal, a second signal having a value representing a detected change in the refractive index of the thin film being deposited on the wafer; and modifying the gas flow set point signal as a function of the first and the second signals.

4. A method of claim 3 comprising:

producing a gas ratio error signal; and producing the first signal with a value representing a desired change in a refractive index of the thin film on the wafer as a function of the flow of the two gases to the thin film processing chamber.

5. A method of claim 4 comprising:

producing, in response to first and second gas flow set point values representing desired flows of the two gases, a gas ratio signal having a value representing a desired ratio of the two gases flowing into the thin film processing chamber and changing as a function of changes in the first and second set point signals;

detecting, in response to first and second measured gas flow signals representing detected flows of the two gases from the gas flow controller, a measured gas flow ratio signal representing a detected ratio of the two gases flowing into the thin film processing chamber and having a value changing as a function of changes in the first and second measured gas flow signals; and producing the gas ratio error signal as a function of the gas ratio set point signal and the measured gas flow ratio signal.

6. A method of claim 5 further comprising producing a time-based integral of the refractive index error of the thin film in response to the gas ratio error signal.

7. A method of claim 6 further comprising producing the second signal in response to the refractive index signal and a refractive index set point signal representing a desired refractive index of the thin film being deposited on the wafer.

8. A method of claim 7 further comprising providing the first and the second gas flow set point signals with a process controller in operative communication with the gas flow controller and the thin film processing chamber.

9. A method of claim 8 further comprising providing the refractive index set point signal with a process controller in operative communication with the gas flow controller and the thin film processing chamber.

10. A method of claim 1 comprising:

initiating the thin film deposition process in accordance with the film thickness setpoint signal representing a desired thickness of the thin film to be deposited on the wafer; and producing in response to the deposition rate feedback signal the film thickness control signal as a function of the deposition rate feedback signal and the difference between the film thickness setpoint signal and the film thickness feedback signal.

11. A method of claim 1 further comprising:

producing a thickness error signal as a function of a difference between the film thickness setpoint signal and the film thickness feedback signal;

producing in response to the deposition rate feedback signal, an integrated deposition rate feedback signal; and producing the film thickness control signal as a function of the integrated deposition rate feedback signal and the film thickness error signal.

* * * * *